United States Patent
Wang et al.

(10) Patent No.: US 10,720,633 B2
(45) Date of Patent: Jul. 21, 2020

(54) MULTILAYER ELECTROCHEMICAL DEVICE

(71) Applicant: Dyson Technology Limited, Wiltshire (GB)

(72) Inventors: Chia-Wei Wang, Ypsilanti, MI (US); Yen-Hung Chen, Ann Arbor, MI (US); HyonCheol Kim, Ann Arbor, MI (US); Marc Langlois, Ann Arbor, MI (US); Myoungdo Chung, Ann Arbor, MI (US); Ann Marie Sastry, Ann Arbor, MI (US); Xiangchun Zhang, Ann Arbor, MI (US)

(73) Assignee: Dyson Technology Limited, Malmesbury, Wiltshire (GB)

(*) Notice: Subject to any disclaimer, the term of this patent is extended or adjusted under 35 U.S.C. 154(b) by 143 days.

(21) Appl. No.: 15/705,414

(22) Filed: Sep. 15, 2017

(65) Prior Publication Data
US 2019/0088924 A1    Mar. 21, 2019

(51) Int. Cl.
*C23C 14/24* (2006.01)
*H01M 4/04* (2006.01)
(Continued)

(52) U.S. Cl.
CPC ......... *H01M 4/0423* (2013.01); *C23C 14/042* (2013.01); *C23C 14/24* (2013.01);
(Continued)

(58) Field of Classification Search
CPC ...... C23C 14/24; C23C 14/042; C23C 14/542
See application file for complete search history.

(56) References Cited

U.S. PATENT DOCUMENTS

| | | | | |
|---|---|---|---|---|
| 5,032,461 | A | * | 7/1991 | Shaw ............... B05D 1/60 118/50.1 |
| 6,214,422 | B1 | * | 4/2001 | Yializis ............ B05D 1/60 427/255.6 |

(Continued)

FOREIGN PATENT DOCUMENTS

| | | | | |
|---|---|---|---|---|
| EP | 0048884 | A2 * | 9/1981 | ............ C23C 13/08 |
| JP | 2010-251075 | | 11/2010 | |

(Continued)

OTHER PUBLICATIONS

Wang, Ben, et al., "Simulation and Optimization of Film Thickness Uniformity in Physical Vapor Deposition". Coatings, 2018, 8, 324, pp. 1-27.*

(Continued)

*Primary Examiner* — Bret P Chen
(74) *Attorney, Agent, or Firm* — Morrison & Foerster LLP

(57) ABSTRACT

A high speed deposition apparatus for the manufacture of solid state batteries. The apparatus can be used for the manufacture of solid state multilayer stacked battery devices via a vacuum deposition process. In various embodiments, the manufacturing apparatus can include a containment vessel, a reactor region, a process region, a work piece, one or more vacuum chambers, and an energy source. A complete stack of battery layers can be manufactured in a single vacuum cycle, having background gas, pressure, and deposition rate optimized and controlled for the deposition of each layer. The work piece can include a drum and a substrate, which can be a commercial polymer or metallic web, that are temperature controlled. Masks can be used to delineate or shape layers within the multi-layer stacked electrochemical device manufactured by embodiments of the apparatus.

20 Claims, 11 Drawing Sheets

(51) Int. Cl.
  *H01M 10/04* (2006.01)
  *H01M 6/00* (2006.01)
  *H01M 10/00* (2006.01)
  *H01M 10/0585* (2010.01)
  *C23C 14/04* (2006.01)
  *C23C 14/54* (2006.01)
  *H01M 6/40* (2006.01)

(52) U.S. Cl.
  CPC ......... *C23C 14/542* (2013.01); *H01M 4/0421* (2013.01); *H01M 6/005* (2013.01); *H01M 10/00* (2013.01); *H01M 10/04* (2013.01); *H01M 10/0404* (2013.01); *H01M 10/0436* (2013.01); *H01M 10/0585* (2013.01); *H01M 6/40* (2013.01); *H01M 2220/30* (2013.01)

(56) References Cited

U.S. PATENT DOCUMENTS

| | | | |
|---|---|---|---|
| 9,627,717 | B1 | 4/2017 | Langlois et al. |
| 9,631,269 | B2 * | 4/2017 | Chung ................ C23C 14/0031 |
| 2002/0105005 | A1 * | 8/2002 | Seo .................... H01L 51/5008 |
| | | | 257/101 |
| 2007/0148351 | A1 * | 6/2007 | Yamazaki ............. C23C 14/042 |
| | | | 427/255.5 |
| 2008/0284929 | A1 * | 11/2008 | Kimura ............... G02F 1/13624 |
| | | | 349/38 |
| 2008/0290287 | A1 * | 11/2008 | David ................... H01J 49/025 |
| | | | 250/396 R |
| 2010/0203387 | A1 * | 8/2010 | Yamamoto .............. H01M 4/13 |
| | | | 429/220 |
| 2011/0030794 | A1 * | 2/2011 | Teng .................... C23C 14/0623 |
| | | | 136/262 |
| 2012/0040233 | A1 | 2/2012 | Kim et al. |
| 2012/0055633 | A1 | 3/2012 | Kim et al. |
| 2012/0058280 | A1 | 3/2012 | Chung et al. |
| 2014/0131198 | A1 * | 5/2014 | Teng ....................... H01L 31/18 |
| | | | 204/298.07 |
| 2014/0166986 | A1 * | 6/2014 | Pang .................... H01L 51/506 |
| | | | 257/40 |
| 2016/0203972 | A1 * | 7/2016 | Sundaram ............. H01L 21/268 |
| | | | 257/76 |

FOREIGN PATENT DOCUMENTS

| | | | |
|---|---|---|---|
| WO | WO 2014/027778 A1 * | 2/2014 | ............ C23C 14/24 |
| WO | 2016/100751 | 6/2016 | |
| WO | 2016/100752 | 6/2016 | |

OTHER PUBLICATIONS

International Search Report and Written Opinion dated Dec. 13, 2018, directed to International Application No. PCT/GB2018/052539; 15 pages.

* cited by examiner

MULTILAYER ELECTROCHEMICAL DEVICE

FIELD OF THE INVENTION

The present invention relates to techniques for manufacturing thin film solid state electrochemical cells. More particular, the present invention provides a method and system for high speed fabrication of a solid-state thin film battery device.

BACKGROUND OF THE INVENTION

Batteries can be used for a variety of applications. The design of such batteries is also applicable to cases in which the battery is not the only power supply in the system, and additional power is provided by a fuel cell, other battery, IC engine or other combustion device, capacitor, solar cell, etc.

Solid state cells are generally in the experimental state, have been difficult to make, and have not been successfully produced in large scale. Effective design and production of solid state cells has not been achieved due to limitations in cell structures and manufacturing techniques.

Solid state batteries have been proven to have several advantages over conventional batteries using liquid electrolytes in lab settings; safety being the foremost one. A solid state battery is intrinsically more stable than liquid electrolyte cells since it does not contain a liquid that can cause an undesirable reaction, resulting in thermal runaway, and potentially an explosion in the worst case scenario.

Despite of the outstanding properties of solid state batteries, there are many challenges to address in the future to make this type of battery available in the market. Termination and packaging of solid state batteries needs to be improved to exploit their compactness and high energy density. Developing low cost techniques for large area and fast film deposition need to be developed to make solid state batteries useful in a variety of applications such as consumer electronics or RFID, etc. Furthermore, better techniques to handle very thin layers of brittle material need to be developed to allow optimization of solid state batteries. Particularly, optimization of those techniques and equipment capable of assembling or manufacturing large numbers of these thin layers are needed.

SUMMARY OF THE INVENTION

According to the present invention, there is provided a apparatus for the manufacture of a thin film battery device comprising a plurality of layers using a vacuum deposition process, the apparatus comprising: a plurality of vacuum deposition devices for depositing the plurality of layers of the thin film battery device; a work piece in the form of a drum coupled to a transfer device with at least one axis of rotation, the transfer device being configured to move the work piece from a first region to a second region in a continuous or intermittent manner, and wherein the work piece is configured to move to a plurality of process regions for the plurality of vacuum deposition devices to deposit the plurality of layers onto the work piece; and one or more vacuum chambers to enclose the work piece within the plurality of process regions. Merely by way of example, the invention has been provided with use of lithium-based cells.

In an embodiment, the present apparatus can be used for the manufacture of solid state multilayer stacked electrochemical devices such as solid state batteries. In various embodiments, the manufacturing apparatus can include a containment vessel, a reactor region, a process region, a work piece, one or more vacuum chambers, and an energy source.

The containment vessel can be configured to deposit a material characterized by a fluid, bendable, meterable, or dispensable form. The containment vessel can include electrochemical materials, such as those used for battery devices, and the like. Also, the containment vessel or deposition sources can be tailored, with regard to number, size, and capability, for each thin film layer to optimize the manufacturing process. The arrangement of the deposition sources can include a subset of the layers of the electrochemical devices, which can require the manufacturing process to use multiple passes of the work piece, or substrate, to complete a device.

In a specific embodiment, the deposited materials or deposition materials can be coupled to a high speed evaporation source or a selection of high speed evaporation sources, which can be arrayed to deposit layers of an electrochemical device. The energy source, or evaporation source(s), can be configured to the reactor to subject the deposition material to energy to substantially evaporate the material and cause deposition of a desired gaseous species. This species can be derived from the evaporated material and deposited onto a surface region of the work piece. In various embodiments, deposited cathode materials can be in a fully discharged to nearly full discharged state. Also, the termination of the electrochemical device is integral to the manufacturing process. This can be accomplished via an additional termination device or apparatus, or through depositing a conducting medium after the deposition of the active layers. Thus, the containment vessel, or deposition sources, can be configured to deposit such a conducting medium after the desired number of electrochemically active layers is formed. The deposition sources can include material for a release layers, barrier layers, as well as other layers and combinations thereof. The containment vessel, or one or more deposition sources, can be configured such that during operation anode and cathode layers can be deposited in an adjacent manner. Configuring the deposition sequence of the materials in this way can eliminate redundant current collector layers.

Shadow masking may be used in the deposition process. The use of a shadow masking system can form delineated or demarked thin layers of an electrochemical device. The system may therefore include a masking device being interposed between the deposition sources, or containment vessels, and the substrate, or work piece, for the purpose of delineating or demarking onto individual thin film layers on the substrate or on other previously deposited layers. The substrate on which materials are deposited can be operated to move in a fixed speed or in a step-and-repeat pattern. In various embodiments, multiple operations of the manufacturing apparatus may be required or an additional deposition apparatus may be implemented. Devices made from embodiments of the present apparatus can have greater than 100 layers.

The reactor region can be coupled to the containment vessel by a transport mechanism, and the process region can be positioned within the reactor region. The work piece can be in the form of a drum or belt within the process region. In a specific embodiment, the work piece can include only one substrate film or layer for the entire electrochemical device. This work piece can be coupled to a transfer device configured to move the work piece from a first region to a second region in a continuous or intermittent manner. Also, the process region can be positioned within a vicinity of the reactor to expose the work piece to the reactor. The work piece can be about 10 cm to 1 m from the reactor.

The one or more vacuum chambers can be in fluid communication with each other. These vacuum chambers can enclose the containment vessel, reactor region, process region, and the work piece within the process region. The separation and packaging of electrochemical devices can take place in vacuum. The deposition of electrochemical materials produces a band or belt of stacked layers, which can be removed and separated into multiple individual devices. Separating and packaging these individual devices can be done via one or more separating means and packaging means. The substrate, which can be electrically conductive and solderable, can be removable after the device is manufacture as well. These can be in the form of addition devices configured with the one or more vacuum chambers. Additionally, a computer device can be configured to control the deposition rates, thicknesses of the layers, and substrate motion is measured and controlled by computer active feedback. Through the computer device, the multiple stacks of thin film layers can be made to be monotonically convergent.

Benefits are achieved over conventional techniques. Depending upon the specific embodiment, one or more of these benefits may be achieved. In an embodiment, the present invention provides an apparatus having the means to deposit over large areas at high speed all of the materials used for thin film batteries. Deposition techniques shown to be useful in this invention include at least one of the following: PVD, CVD, Plasma Enhanced CVD, sputtering, reactive sputtering, plasma arc, thermal and plasma spray, aerosol and the like coupled to a substrate that is located on a rotating drum or belt inside of a vacuum chamber designed for this purpose. It should be noted that this invention envisions a common element to be the deposition of layers for this solid state battery to be deposited on a solid moving substrate, the solid moving substrate being so arranged as to not subject said layers to physical touching or the ability to impart any damage. It is this unique building of layers atom by atom, one on top of the other, including to very large numbers of layers, without individual handling that is one of the unique elements of invention.

In an embodiment, multiple individually-controlled deposition sources are arrayed across the x-web or x-machine direction positioned apart from each other at an x and y distance calculated to provide the most uniform film thickness as deposited on the rotating drum or belt. An added benefit of this design is the ability to measure the thickness of deposition from each source, and control said source to provide a continuously monitored and controlled even thickness of film correcting perturbations in the output of said deposition source.

Another embodiment of this invention is the use of movable arrays of singular individual deposition sources arrayed so as to allow a quick change of position under the rotating drum or belt in the deposition area. This allows for the rapid deposition of different layers on the same substrate in the same apparatus.

Another embodiment of this invention is the optimization of deposition source matched to deposition material. In this way, economies of deposition material, deposition rate, and deposition uniformity are possible, thus leading to manufacturing the lowest cost battery.

Yet another embodiment of this invention is the use of multiple deposition drums or belts arrayed around a multitude of fixed deposition sources. When configured for optimum throughput, this unique arrangement allows for the simultaneous deposition of all layers at the same time significantly reducing the manufacturing time. An added benefit of this embodiment of the invention is the significant reduction in capital cost due to the incremental only increase in hardware needed as vacuum pumps, transport hardware and controls are shared.

A further embodiment of this invention pertains to the arrangement of individual deposition sources, either single or multiple as described above, placed so as to occupy positions circumferential to the rotating drum or belt. It should be noted here that the orientation of the axis of the rotating drum(s) or belt(s) may be horizontal or vertical.

A further embodiment of his invention pertains to the added benefit of utilizing a belt whose shape is essentially a flat ovoid, such that there is presented a long, flat, and linear deposition area. Furthermore, it is envisioned in this invention to utilize heating and cooling of the substrate optimized for each deposition source and deposition material.

It should also be noted the vacuum chamber used to house this invention may include one or more chambers, which communicate fluidly; and further may comprise sub-chambers or baffles. These sub-chambers or baffles can be arranged so as to provide both an environment suitable to the individual deposition source optimized for each particular deposition material, and to provide containment of that environment such that it does not interfere with the deposition, deposition quality, or film quality of the adjacent deposition source. This design principle is envisioned to be consistent in some significant manner across many embodiments of the present invention.

The work piece may be a reel-to-reel substrate cassette configured to mobilise the substrate material over the drum during the deposition of the plurality of layers. The deposition process in each device can occur as the reel of substrate is unwound and rewound over the drum. The fully rewound cassette of substrate can then be removed from the deposition device and placed in the subsequent deposition device. The deposition devices may be provided in an in-line formation, in contrast to a standard cluster tool arrangement, such that the work piece is delivered along a linear production line.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
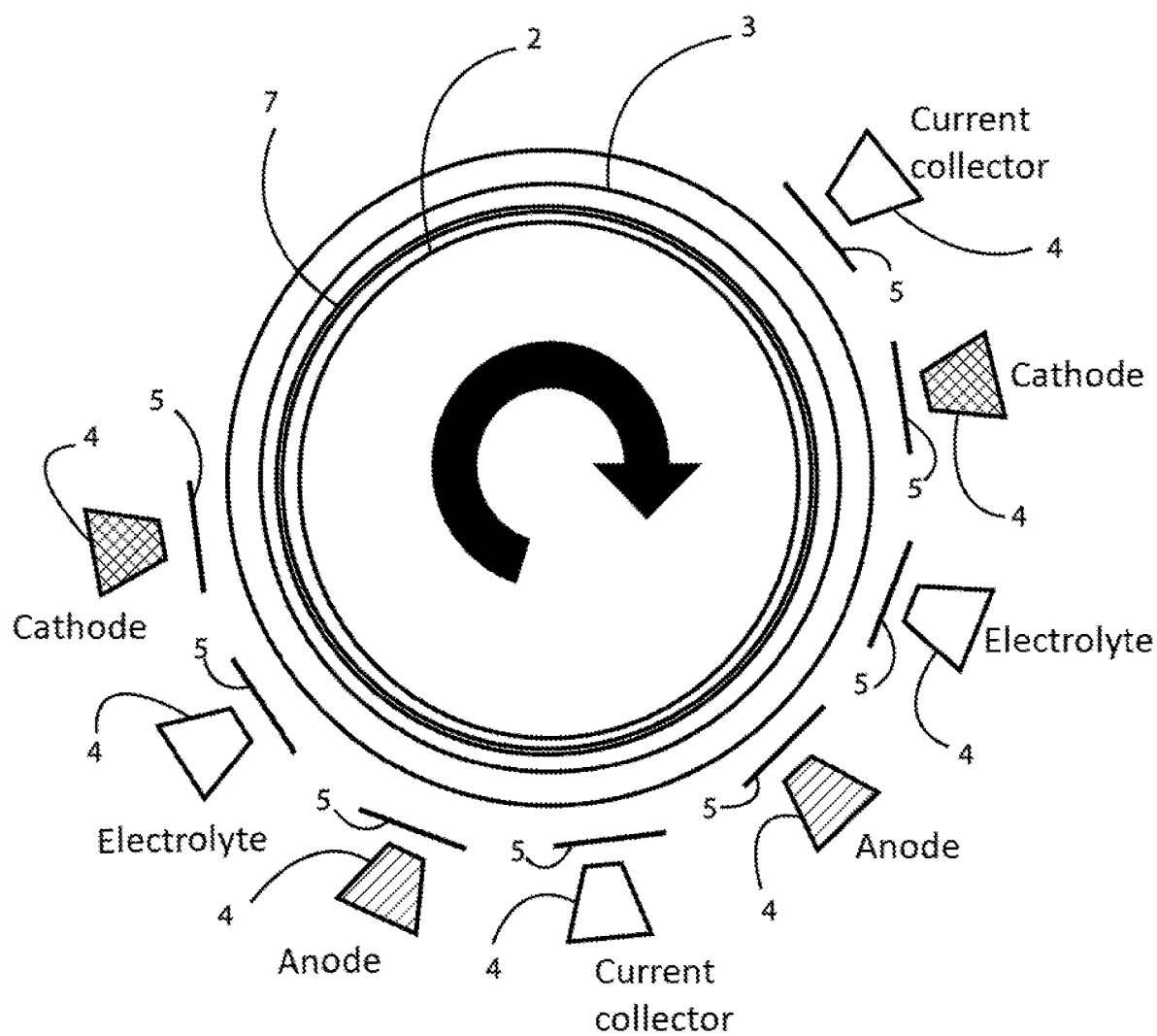
FIG. 1 is a cross-sectional view of a simplified diagram of a vacuum deposition apparatus according to an embodiment of the present invention.

FIG. 1 is a side view of a simplified diagram of a vacuum deposition apparatus according to an embodiment of the present invention. As shown, this embodiment is a vacuum coating apparatus including a round vacuum chamber 3. Inside the vacuum chamber 3 is a large temperature controlled drum 2, which rotates freely. The temperature control occurs by embedded electrical heaters, passageways for the flow of temperature controlled fluid or gas, or a combination thereof. Heating or cooling of the drum may be accomplished and utilized as needed by the deposition material and finished solid state battery.

Disposed around this chamber 3, either in the same vacuum volume or protruding through the wall of the vacuum chamber 3, are multiple vacuum deposition devices 4, each intended to deposit one layer of a solid state battery. By rotation of the drum, and the concurrent deposition of said layers both in continuous and/or in registration with drum rotation, a strap or band of multilayer solid state devices 7 is manufactured.

Between each deposition source 4 and the drum 3 is a mask 5 to limit the area of deposited material from each deposition source. This mask 5 can cause the material coating on said drum to be formed as a delineated layer or stack of layers within solid state devices. The delineated layers formed via the mask 5 can be both in registration with layers above and below it, and conforming to a desired pattern designed to optimize the desired properties of said solid state device or battery. This masking device 5 may also move radially with the stack of thin film layers to keep a very small tolerance in overlap of layers, thus improving the desired properties of said battery. Masking materials may also include liquid or vapor deposited upon the drum or underlying layers inhibiting the deposition of the next layer to those uncovered or unmasked areas. The masks 5 can also include belts of solid material, such as steel or high temperature plastic, which touch the drum and move at the same surface speed as the drum preventing deposition from taking place under them. These solid type masks have a further benefit of preventing scratching or other physical damage to the underlying layers. Solid masks, liquid masks, vapor masks, or other mask types can be used, as well as combination of the above mentioned types.

As shown, in this embodiment, all layers are deposited at the same time in order to reduce the overall manufacturing time of a set of stacked or individual electrochemical devices, such as solid state batteries. After depositing the required number of individual layers, the strap or band of multilayer solid state devices 7 is removed from the vacuum chamber and drum and separated into individual batteries for test and packaging.

As described above, the apparatus can be used for the manufacture of solid state multilayer stacked electrochemical devices, such as solid state batteries, via a vacuum deposition process. In various embodiments, the manufacturing apparatus can include a containment vessel, a reactor region, a process region, a work piece, one or more vacuum chambers, and an energy source.

The containment vessel can be configured to deposit a material characterized by a fluid, bendable, meterable, or dispensable form. The containment vessel can include electrochemical materials, such as those used for battery devices, and the like. Also, the containment vessel or deposition sources can be tailored, with regard to number, size, and capability, for each thin film layer to optimize the manufacturing process. The arrangement of the deposition sources can include a subset of the layers of the electrochemical devices, which can require the manufacturing process to use multiple passes of the work piece, or substrate, to complete a device.

In a specific embodiment, the deposited materials or deposition materials can be coupled to a high speed evaporation source or a selection of high speed evaporation sources, which can be arrayed to deposit layers of an electrochemical device. The energy source, or evaporation source(s) can be configured to the reactor to subject the deposition material to energy to substantially evaporate the material and cause deposition of a desired gaseous species. This species can be derived from the evaporated material and deposited onto a surface region of the work piece through a shadow masking system. In various embodiments, deposited cathode materials can be in a fully discharged to nearly full discharged state. Also, the termination of the electrochemical device is integral to the manufacturing process. This can be accomplished via an additional termination device or apparatus, or through depositing a conducting medium after the deposition of the active layers. Thus, the containment vessel, or deposition sources, can be configured to deposit such a conducting medium after the desired number of electrochemically active layers is formed. The deposition sources can include material for a release layers, barrier layers, as well as other layers and combinations thereof. The containment vessel, or one or more deposition sources, can be configured such that during operation anode and cathode layers can be deposited in an adjacent manner. Configuring the deposition sequence of the materials in this way can eliminate redundant current collector layers.

The system can include a masking device being interposed between the deposition sources, or containment vessels, and the substrate, or work piece, for the purpose of delineating or demarking onto individual thin film layers on the substrate or on other previously deposited layers. As an example, the use of a shadow masking system can form delineated or demarked thin layers of an electrochemical device. The substrate on which materials are deposited can be operated to move in a fixed speed or in a step-and-repeat pattern. In various embodiments, multiple operations of the manufacturing apparatus may be required or an additional deposition apparatus may be implemented. Devices made from embodiments of the present apparatus can have greater than 100 layers.

Furthermore, benefits can include having no intermediate substrate or parasitic materials between active layers of the device. A manufacturing process utilizing embodiments of the present apparatus can economically generate and deposit hundreds to thousands of very thin layers with high fidelity and yield. Such a process can also manufacture multiple stacked layers with no handling or touching of layers or transport between handling units, such as rollers, slitters, ovens, stackers, welders, etc. This leads to significant improvements in quality and performance, as well as increased yield. Process steps between deposition and fully terminating an electrochemical device can be eliminated (self-terminated or post-terminated) as well. Through direct deposition, interface impedance can be significantly reduced due to the atom by atom deposition of each active layer upon the layer below while remaining under a controlled vacuum environment.

Through moving masking, any number of devices can be stacked in a series and/or parallel configuration, which can be done without adding any appreciable process steps or introducing any opportunities for defects due to handling, misalignment, etc. Significantly reduced margins can be utilized between active layers due to the precise alignment of the components of the apparatus embodiments. This can be accomplished with the electrochemical devices being in intimate contact with the work piece or drum, and by using step-and-repeat processes. In variously embodiments, using a compact, low capital cost, fully computer controlled manufacturing apparatus being specifically optimized with deposition materials and utilizing proven feedback control technology can improve manufacturability of electrochemical devices, such as solid state batteries. Also, graded layers (which enhances performance without significantly increasing costs or decreasing yields), barrier layers, or other protective layers can be deposited in a the controlled vacuum environment of such apparatus embodiments to reduce manufacturing costs and increase yield by producing pre-packaged devices, or even packaged devices.

The present invention achieves these benefits and others in the context of known process technology. However, a further understanding of the nature and advantages of the present invention may be realized by reference to the latter portions of the specification and attached drawings.

Figure 2:
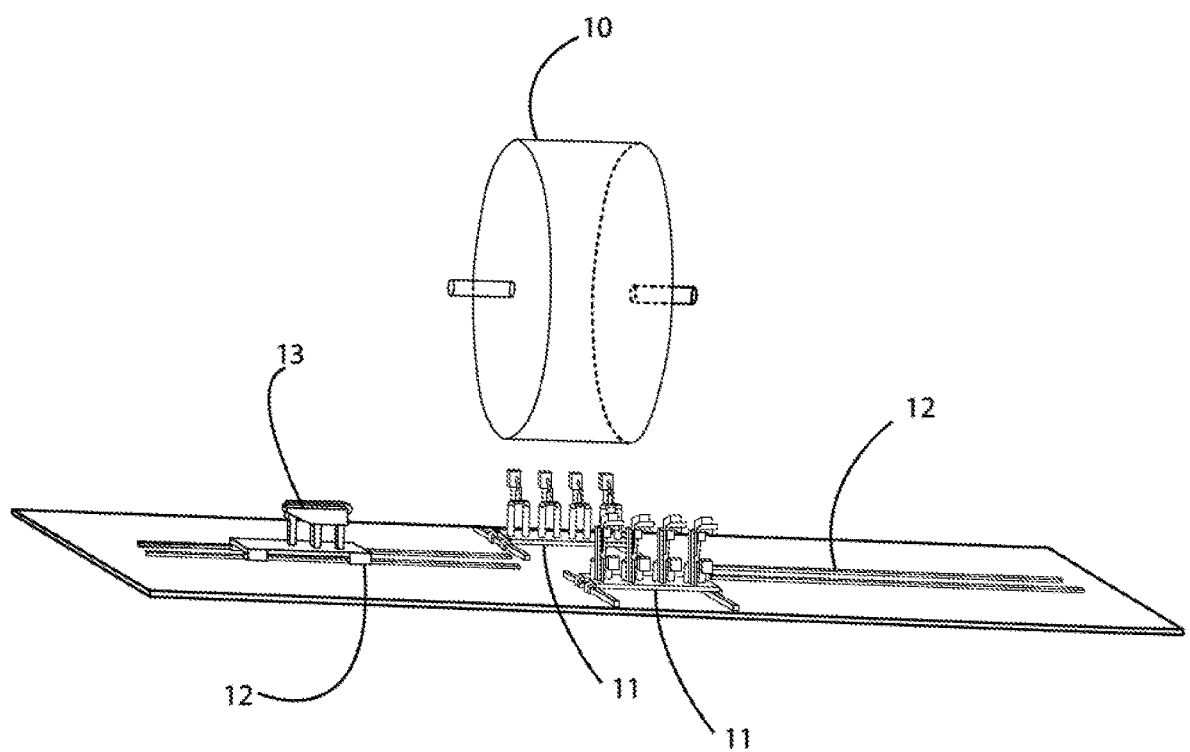
FIG. 2 is a perspective view of a simplified diagram of a vacuum deposition apparatus according to an embodiment of the present invention.

FIG. 2 is a perspective view of a simplified diagram of a vacuum deposition apparatus according to an embodiment of the present invention. As shown, this embodiment includes a vacuum coating apparatus consisting of a vacuum chamber. Inside the vacuum chamber is a large temperature controlled drum 10, which rotates freely. Vacuum environments are tailored to the individual deposition materials and are designed so as to prevent contamination of adjacent depositions. Vacuum levels vary in the range of 0.5 Torr to $1 \times 10^{-7}$ Torr and temperatures in the range of $-20$ C.° to $+100$ C.° are envisioned.

In this embodiment, in place of the deposition sources 11 and 13 are configured around the circumference of the drum 10. Deposition sources 11 and 13 are mounted to a movable apparatus 12 such that they may be moved under the drum 10 and masking system as described above for FIG. 1. This configuration is particularly useful with deposition sources, which rely on gravity to hold molten or liquid deposition material. In this embodiment, layers of material for an electrochemical device are deposited sequentially.

After deposition, the strap or band of electrochemical devices is removed from the vacuum chamber and drum and separated into individual batteries for test and packaging. Those of ordinary skill will recognize other variations, modifications, and alternatives.

Figure 3:
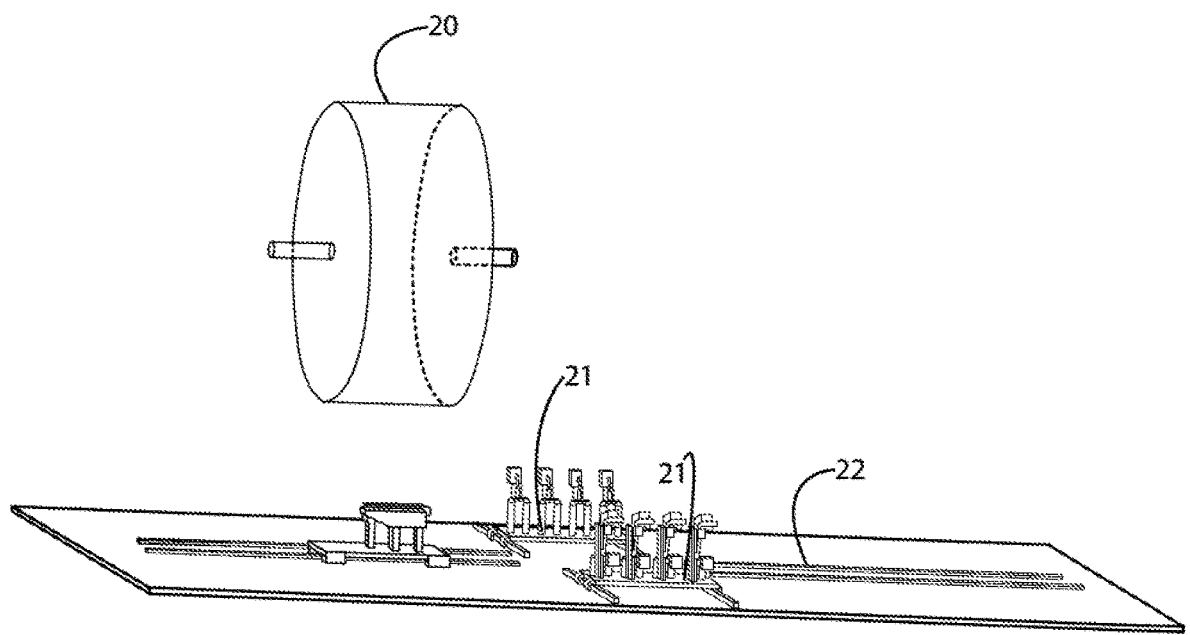
FIG. 3 is a perspective view of a simplified diagram of a vacuum deposition apparatus according to an embodiment of the present invention.

FIG. 3 is a perspective view of a simplified diagram of a vacuum deposition apparatus according to an embodiment of the present invention. As shown, this embodiment consists of a vacuum coating apparatus including a vacuum chamber. Inside the vacuum chamber is a large temperature controlled drum 20, which rotates freely.

In this embodiment, the deposition sources 21 are fixed and the substrate drum 20 and a subsequent masking system is moved to a position above the appropriate deposition source via a system such as tracks 22. In this embodiment, thin film layers of materials for an electrochemical device are deposited sequentially. This embodiment is particular useful where deposition sources and their utilities are large, complicated, and difficult to move.

After deposition, the strap or band is removed from the vacuum chamber and drum and separated into individual batteries for test and packaging. Those of ordinary skill will recognize other variations, modifications, and alternatives.

Figure 4:
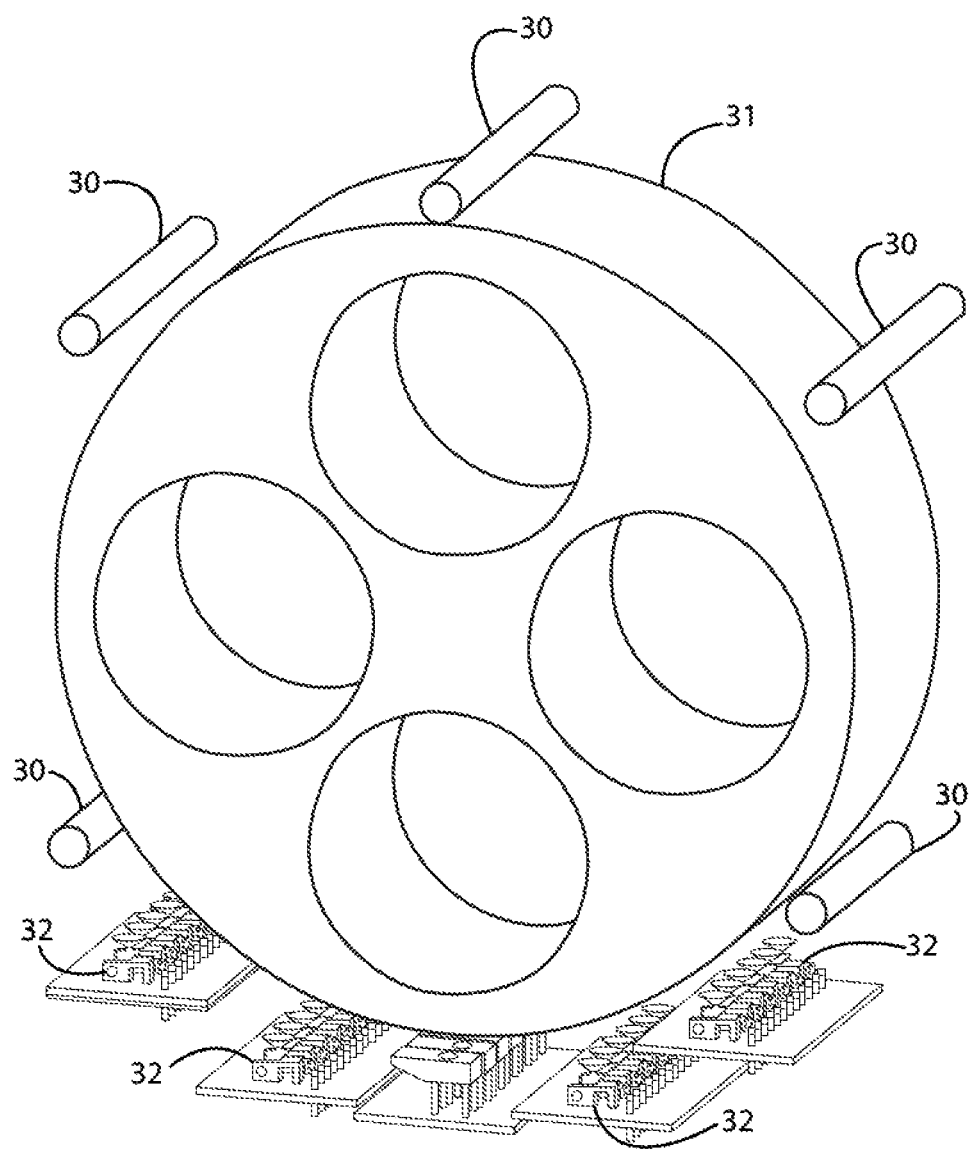
FIG. 4 is a perspective view of a simplified diagram of a vacuum deposition apparatus according to an embodiment of the present invention.

FIG. 4 is a perspective view of a simplified diagram of a vacuum deposition apparatus according to an embodiment of the present invention. This apparatus embodiment can be considered a hybrid between the embodiments shown in FIGS. 1 and 2. As shown, this embodiment consists of a vacuum coating apparatus including a vacuum chamber. Inside the vacuum chamber is a large temperature controlled drum 31 which rotates freely.

Disposed around this chamber, either in the same vacuum volume, or protruding through the wall of the vacuum chamber are a multiple of vacuum deposition devices 30 and 32. Deposition device 32 may rely on gravity for containment of melted or liquid deposition materials, whereas deposition device 30 would not need such constraints. Each deposition source 30/32 is intended to deposit one layer of a solid state battery. By rotation of the drum, and the concurrent deposition of said layers both in continuous and/or in registration with drum rotation, a strap or band of multilayer solid state devices is manufactured.

Between each deposition source 30/32 and the drum 31 is a mask 33 to limit the area of deposited material from each deposition source. These masks 33 can cause the material coating on said drum to be formed as a delineated layer or stack of layers within solid state devices. The delineated layers formed via masks 33 can be both in registration with layers above and below it, and conforming to a desired pattern designed to optimize the desired properties of said solid state device or battery. These masking devices 33 may also move radially with the stack of thin film layers to keep a very small tolerance in overlap of layers, thus improving the desired properties of said battery.

As can be seen, in this embodiment, all layers are deposited at the same time reducing the time to manufacture a set of stacked or individual electrochemical devices, such as solid state batteries. After deposition, the strap or band of electrochemical devices is removed from the vacuum chamber and drum 31 and separated into individual batteries for test and packaging. Those of ordinary skill will recognize other variations, modifications, and alternatives.

Figure 5:
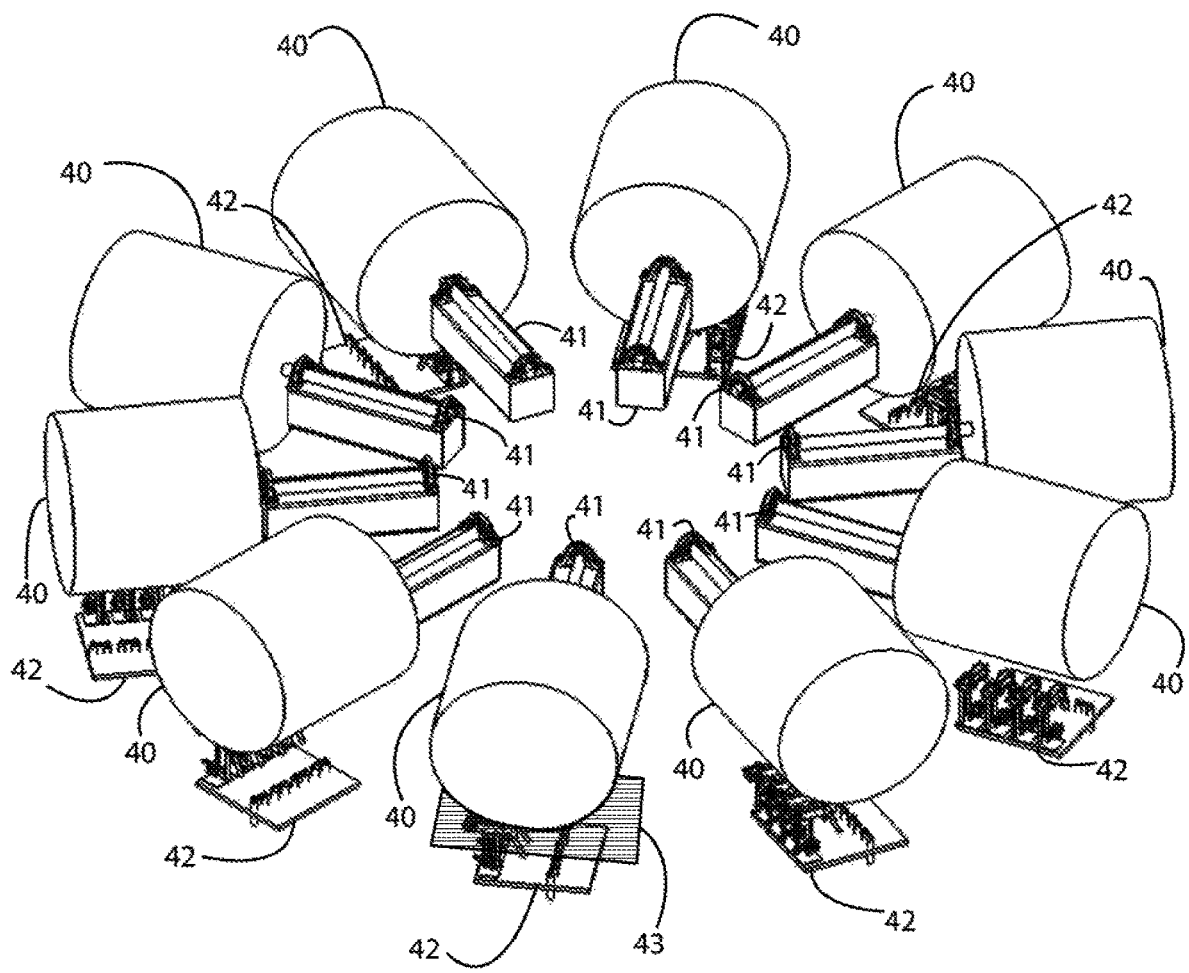
FIG. 5 is a perspective view of a simplified diagram of a vacuum deposition apparatus according to an embodiment of the present invention.

FIG. 5 is a perspective view of a simplified diagram of a vacuum deposition apparatus according to an embodiment of the present invention As shown, this embodiment consists of a vacuum coating apparatus including a vacuum chamber. Inside the vacuum chamber are several large temperature controlled drum 40, which rotates freely and can be indexed by mounting 41.

In this embodiment, the deposition sources 42 are fixed and the substrate drums 40 and subsequent masking systems 42 are moved to a position above the appropriate deposition source via indexing system 41. In this embodiment, the number of drums 40 and the number of deposition sources 42 are configured to allow all layers of an electrochemical cell, such as a solid state battery to be deposited at the same time.

The rotating drums 40 will index adding layers as appropriate to the design until all layers have been made. This embodiment is particularly useful where deposition times are long or deposition rates are slow, or film thicknesses are large. This configuration is also particularly useful where thicknesses of layers need to be precisely controlled due to the inherent ability to rotate the drum or drums rapidly during deposition and measure the resultant thickness. In this way, any non-uniformities in deposition rate are evened out by the large number of rotations and very thin individual contributions to the total thickness afforded during each rotation.

After deposition, the straps or bands of electrochemical devices are removed from the vacuum chamber and drum and separated into individual batteries for test and packaging. Those of ordinary skill will recognize other variations, modifications, and alternatives.

Figure 6:
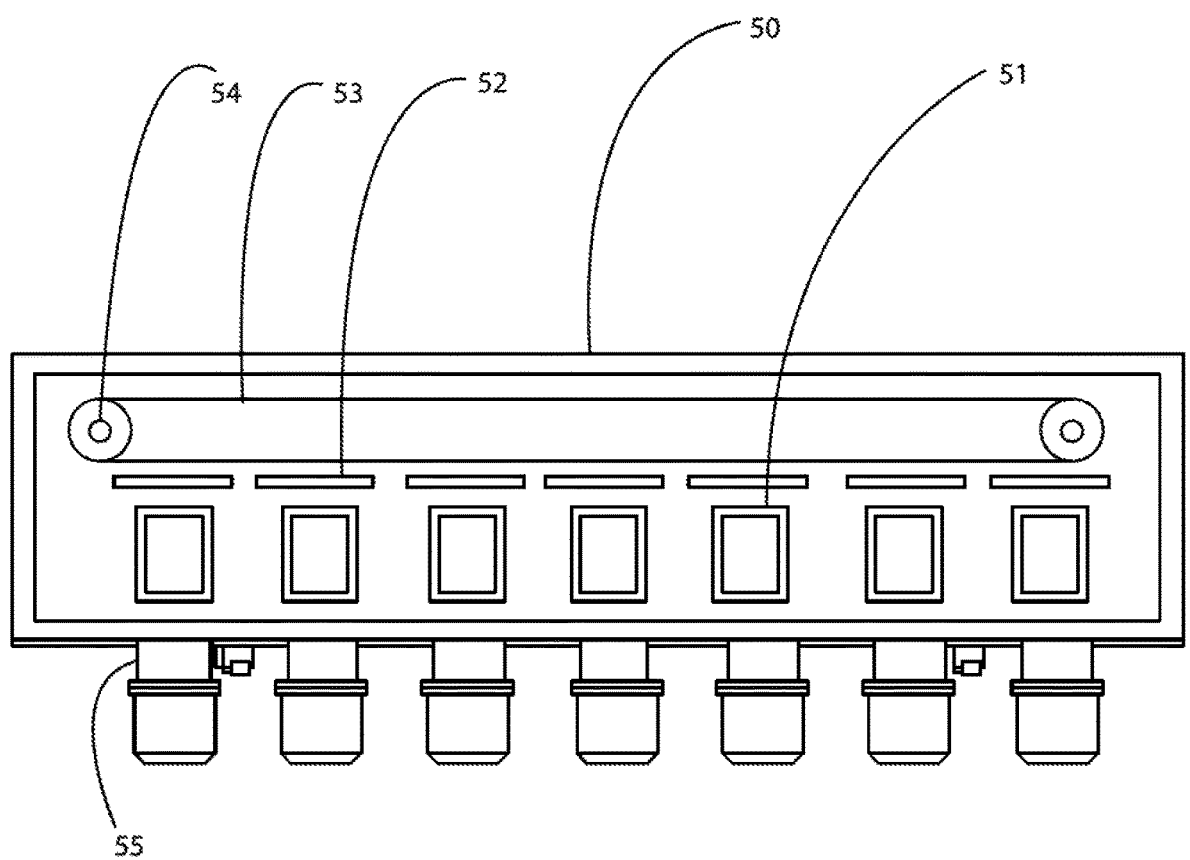
FIG. 6 is a cross-sectional view of a simplified diagram of a vacuum deposition apparatus according to an embodiment of the present invention.

FIG. 6 is a cross-sectional view of a simplified diagram of a vacuum deposition apparatus according to an embodiment of the present invention. This apparatus embodiment can be a hybrid between the embodiments shown in FIGS. 1 and 4. As shown, this embodiment consists of a vacuum coating apparatus including a vacuum chamber 50, either round or rectangular, or any other shape, such as polygonal as required with appropriate pumping 55. inside the vacuum chamber is an endless metal or polymer belt 53, which rotates freely via rollers 54.

In an embodiment, one or more vacuum deposition devices 51 are disposed under the belt 53, either in the same vacuum volume, or protruding through the wall of the vacuum chamber. Each deposition source 51 is intended to deposit one layer of a solid state battery. These deposition sources 51 may be assembled from multiple individual deposition sources so arranged to deposit at very high rate and uniformity and may consist of multiple arrays of any one layer in order to equalize the thickness of any layer to all other layers. These deposition sources may also consist of linear or circular vessels which are heated by induction, resistance, electrons, ions, or radiant energy. Furthermore, these vessels may be equipped with deposition uniformity shields consisting of slots, blades, ovoids, and other shapes.

By rotation of the belt 53, and the sequential deposition of said layers both in continuous and/or in registration with drum rotation, a strap or band of multilayer solid state devices is manufactured.

In an embodiment, a mask 52 is disposed between each deposition source 51 and the drum to limit the area of deposit from each deposition source. This masking provides the means to coat on said belt 53 a layer or stack of device layers as a delineated layer of the solid state device both in registration with layers above and below it. The delineated layer can also be formed conforming to a desired pattern designed to optimize the desired properties of said solid state device. This masking device 52 may in addition move parallel with the stack of thin film layers on the belt 53 to afford a very small tolerance in overlap of layers thus improving the desired properties of said battery.

As can be seen, in this embodiment, all layers are deposited at the same time reducing the time to manufacture a set of stacked or individual electrochemical devices, such as solid state batteries. After deposition, the strap or band of electrochemical devices is removed from the vacuum chamber and drum and separated into individual batteries for test and packaging.

Figure 7:
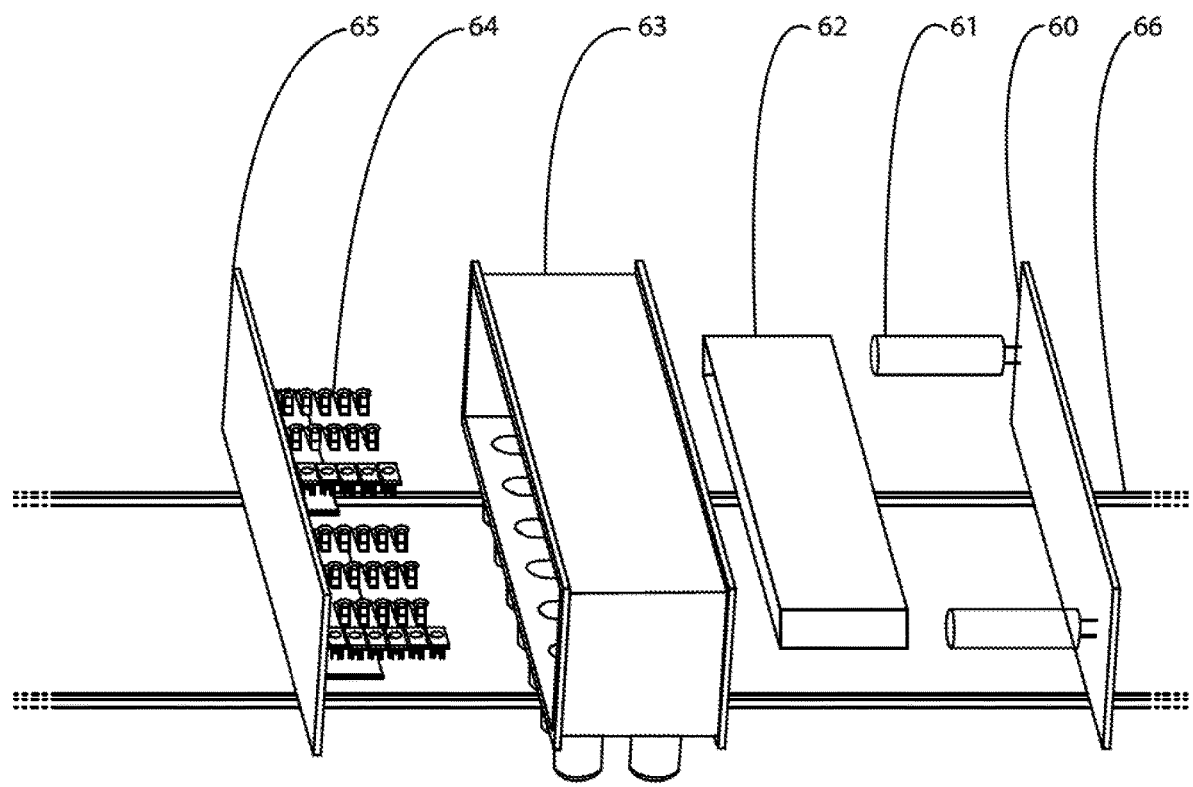
FIG. 7 is a perspective view of a simplified diagram of a vacuum deposition apparatus according to an embodiment of the present invention.

FIG. 7 is a perspective view of a simplified diagram of a vacuum deposition apparatus according to an embodiment of the present invention. As shown, this embodiment includes a stationary vacuum chamber 63, a movable bulk head 65, one or more deposition sources 64, a drum or belt and a rotating means 61 for the drum or belt, a strap or drum liner and strap and removal means for the strap or belt, an opening means 63 for the vacuum chamber, rails 66, and a moving substrate device. The deposition sources 64 can be configured to be easily serviced and to use masks, such as those described previously. The moving substrate device can include a drum or belt configured for roll-to-roll manufacturing. The means for opening the vacuum chamber 63 can be configured to allow easy access to the internal components, such as the rails 66. Such a vacuum deposition apparatus can be used to manufacture individual or multiple 3-dimensional electrochemical devices, such as solid state batteries, in a continuous or step-and-repeat process.

In an embodiment, the arrangement of the coating drum can be configured for stationary deposition and utilize masking devices to sequentially deposit, either in continuous rotation of a step-and-repeat drum alignment for each layer. The arrangement of deposition and/or masking can also be configured to have a fixed location drum to sequentially deposit, in a continuous rotation or step-and-repeat process, each electrochemical layer. Details regarding various configurations and elements of apparatus embodiments are described previously. Those of ordinary skill in the art will recognize other variations, modifications, and alternatives.

Figure 8:
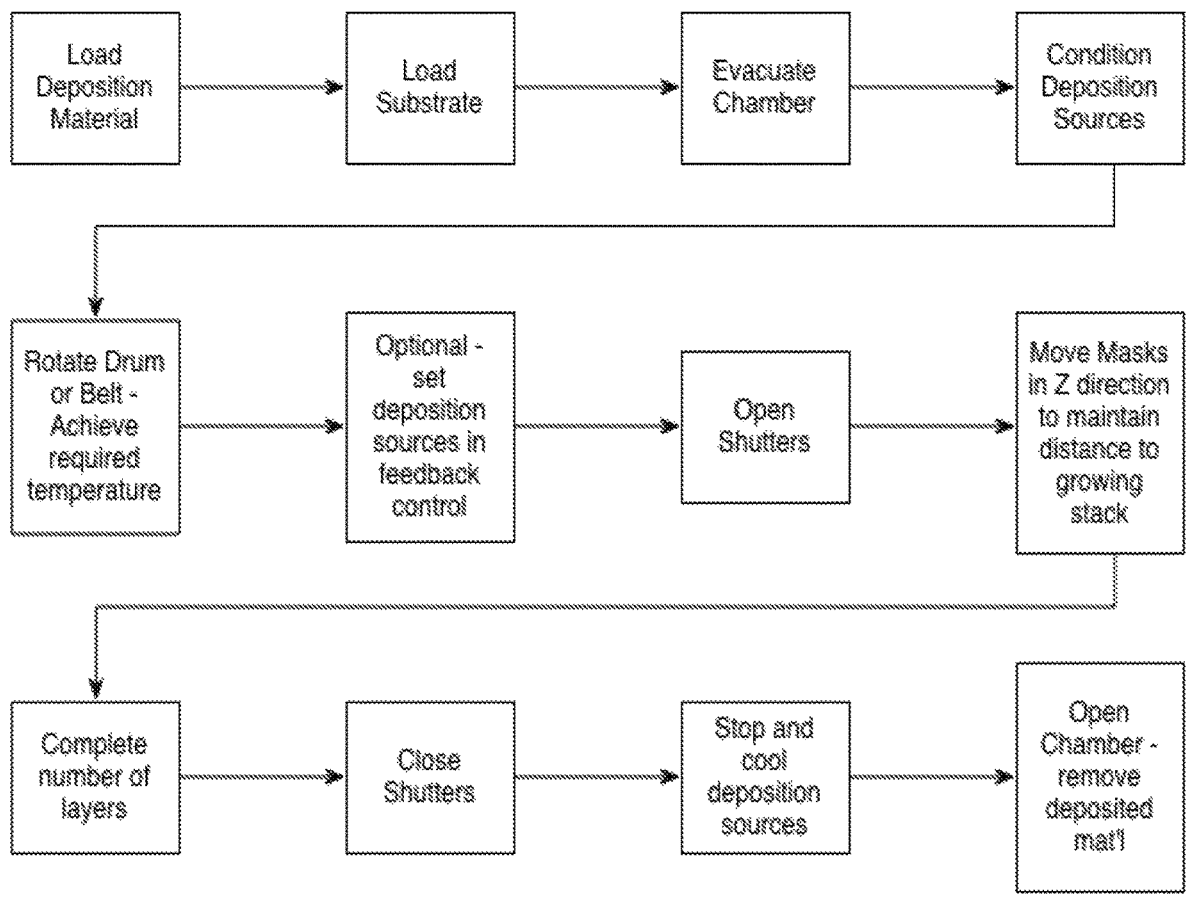
FIG. 8 is a simplified flow diagram of a method of operating a vacuum deposition apparatus according to an embodiment of the present invention.

FIG. 8 is a simplified flow diagram of a method of operating a vacuum deposition apparatus according to an embodiment of the present invention. The method begins with loading the materials to be deposited, readying the apparatus for manufacturing operation. The deposition materials are loaded, either in the deposition sources themselves or in vessels in fluid communication with the deposition source(s), as detailed in U.S. patent application Ser. No. 13/292,368. Next, the apparatus is evacuated to the proper vacuum conditions. As detailed above, the specific vacuum conditions vary, or may vary, for each individual layer deposited. As way of an example, a PVD produced layer may require a vacuum level less than $5 \times 10^{-5}$ Torr, while a CVD produced layer may require a vacuum level of at least 0.5 Torr.

Next, the deposition sources are conditioned. This, as detailed above, may consist of different steps depending upon the material and deposition technique utilized. By way of example, if sputtering of the current collector is chosen, then the appropriate background gas is injected to bring that portion of the vacuum chamber to the appropriate vacuum level, in the range of 5 microns; while if the layer in question is deposited by PVD, then the resistance heaters need to be brought to operating temperature. There may be special variations of these preparations such as degassing, or heating to an intermediate level to allow soaking of the deposition material prior to readiness. Appropriate variations, modifications, and alternatives will be recognized. The rotating drum or belt is then brought to the correct temperature and motion is applied. Optionally, the deposition sources can be set in feedback control.

Following the stabilization of the drum or belt speed, the automatic feedback instrumentation is engaged. This may be composed of optical, microbalance, resistance, temperature or other feedback techniques, as detailed in U.S. patent application Ser. No. 13/291,845 herein. Once the feedback instrumentation is performing according to programmed conditions, the shutters are opened over each deposition source in order. This order is determined by the design of the solid state battery and is such that base layers are fully formed before additional layers are applied. This action then continues until all layers are formed.

During this process, masks may be used within the deposition process to form patterned structures, or the like. Specifically, masks may be moved (i.e., in the z direction) to maintain distance to the growing stack device. Afterwards, the shutters are closed in reverse order or in an order to produce the proper design of the battery. Next, a barrier layer or other layers are deposited. This deposition may consist of a preparation stage similar to that required for the battery layers. Finally, all deposition sources are brought to a stand by or off condition and allowed to cool—flushed if necessary. After all components are of the correct temperature, including the rotating drum or belt, the coater is vented with the proper gas and brought to atmospheric pressure. The apparatus can then be opened and the strap of batteries removed for further processing.

The apparatus of the invention may include additional processing steps to singulate and terminate the individual batteries. Those of ordinary skill in the art will recognize other variations, modifications, and alternatives.

Figure 9:
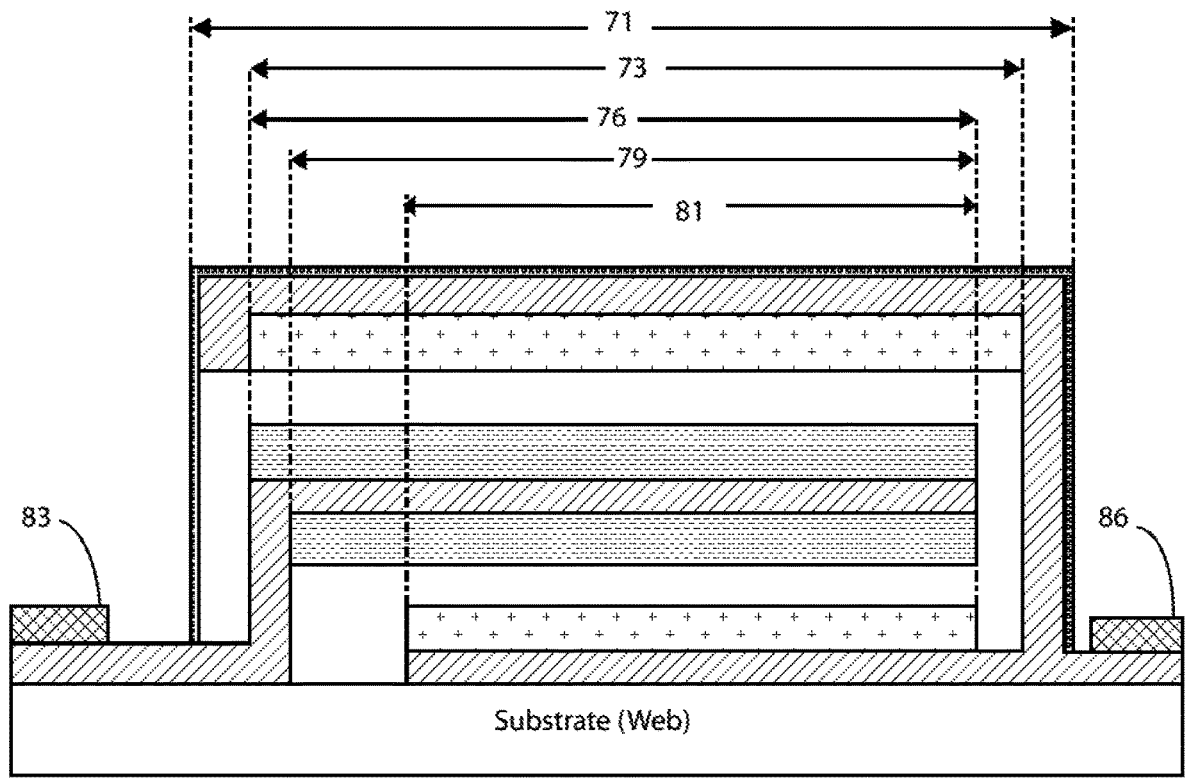
FIG. 9 is cross-sectional view of a simplified diagram of an electrochemical device produced using a vacuum deposition apparatus according to an embodiment of the present invention.

FIG. 9 is cross-sectional view of a simplified diagram of an electrochemical device produced using a vacuum deposition apparatus according to an embodiment of the present invention. As shown, one of the MER or repeating stacks, which may be produced by embodiments of the present apparatus and method, includes a variety of electrochemical materials (barrier, anode, electrolyte, cathode, current collector, etc.). As can be seen, the effects of the shields described in detail above are clearly evident. Various lengths in the cross substrate motion direction (X direction) are shown in FIG. 9: length of the cathode current collector 71, length of the a first cathode 73, length of a first anode 76, length of a second anode 79, and length of a second cathode 81. The self-termination of the anode and cathode current collectors are shown as well. Turning to item 83, it can be seen that the anode current collector termination is thus automatically generated as a result of the masking process, likewise, in item 86 it can be seen that the cathode current collector termination is also thus automatically generated. A detailed process flow diagram of this arrangement is shown in FIG. 10.

Figure 10:
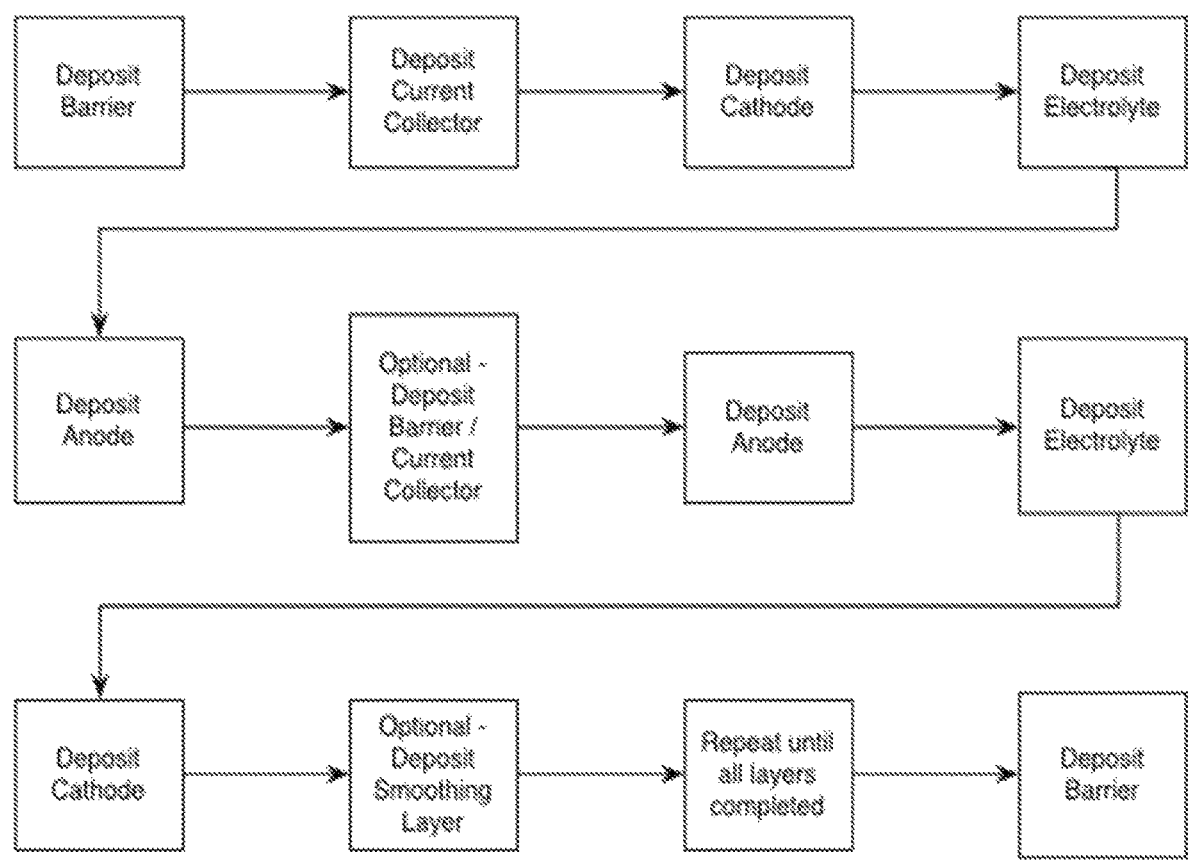
FIG. 10 is a simplified flow diagram of manufacturing an electrochemical device via a vacuum deposition apparatus according to an embodiment of the present invention.

FIG. 10 is a simplified flow diagram of manufacturing an electrochemical device via a vacuum deposition apparatus according to an embodiment of the present invention. As an example, this flow diagram describes an order of deposition for a particular configuration of an electrochemical device. This deposition sequence begins with depositing a barrier layer and a current collector layer. Next, a cathode layer, and electrolyte layer, and an anode layer can be sequentially deposited. An optional barrier or current collector layer can be deposited thereafter. Then, an anode layer, an electrolyte layer, and a cathode layer can be deposited in sequence. Following this stack, an optional smoothing layer may be deposited. This overall sequence can be repeated until a desired stack size before finishing with another barrier layer deposition.

Figure 11:
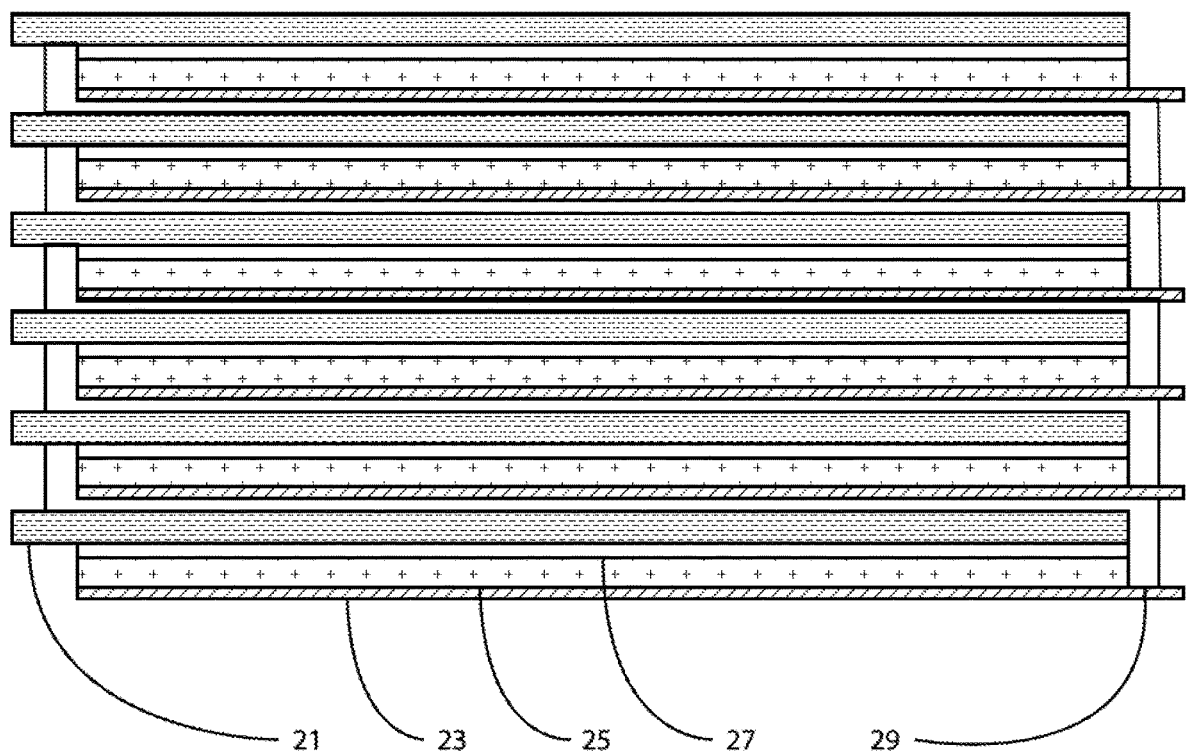
FIG. 11 is a cross-sectional view of a simplified diagram of an electrochemical device produced using a vacuum deposition apparatus according to an embodiment of the present invention.

FIG. 11 is a cross-sectional view of a simplified diagram of an electrochemical device produced using a vacuum deposition apparatus according to an embodiment of the present invention.

As way of a further example, FIG. 11 depicts another aspect of the preferred embodiment. Here is clearly shown the repeating MER or battery stack consisting of current collector 23, cathode 25, electrolyte 27, anode 21 and smoothing layer 29. As shown, this MER produces one battery cell, while the embodiment in FIG. 9 produces two battery cells per MER. Advantages of producing devices such as those shown in FIG. 9 include higher capital cost and higher production rate with higher total energy density, while that embodiment described in FIG. 11 includes lower capital cost, lower production rate, with slightly lower energy density.

While the above is a full description of the specific embodiments, various modifications, alternative constructions and equivalents may be used. Therefore, the above description and illustrations should not be taken as limiting the scope of the present invention which is defined by the appended claims.

The invention claimed is:

1. An apparatus for the manufacture of a thin film battery device comprising a plurality of layers using a vacuum deposition process, the apparatus comprising:
   a plurality of vacuum deposition devices for depositing the plurality of layers of the thin film battery device;
   a work piece comprising a substrate and one or more deposited layers supported on a drum coupled to a transfer device with at least one axis of rotation, the transfer device being configured to move the work piece from a first region to a second region in a continuous or intermittent manner, and wherein the work piece is configured to move to a plurality of process regions for the plurality of vacuum deposition devices to deposit the plurality of layers onto the work piece;
   a masking device located between at least one vacuum deposition device of the plurality of vacuum deposition devices and the work piece and configured to move with the work piece; and
   one or more vacuum chambers to enclose the work piece within the plurality of process regions.

2. The apparatus of claim 1, wherein each of the vacuum deposition devices comprises a plurality of evaporation sources to deposit a layer of the thin film battery device.

3. The apparatus of claim 1, wherein the masking device is configured for delineating or demarking one or more of the plurality of layers of the thin film battery device.

4. The apparatus of claim 1, wherein the work piece includes only one substrate film or layer for the manufacturing of an entire thin film battery device.

5. The apparatus of claim 1, wherein the apparatus is configured to deposit materials for a thin film battery device having greater than 100 layers.

6. The apparatus of claim 1, wherein the apparatus is configured to deposit a cathode material such that the state of charge is fully discharged or nearly fully discharged.

7. The apparatus of claim 1, further comprising a separation device within the one or more vacuum chambers for separating individual thin film battery devices in vacuum.

8. The apparatus of claim 1, further comprising a packaging device within the one or more vacuum chambers for packaging individual thin film battery devices in vacuum.

9. The apparatus of claim 1, further comprising a termination device to subject the thin film battery devices to termination.

10. The apparatus of claim 1, wherein the containment vessel is configured to deposit a conducting medium, the conducting medium providing termination of the electrochemical devices after the deposition of one or more active layers of materials.

11. The apparatus of claim 1, further comprising a computer device configured to control deposition rates, thicknesses of the plurality of layers, and work piece motion by computer active feedback.

12. The apparatus of claim 1, wherein the substrate is removable after the thin film battery devices are manufactured.

13. The apparatus of claim 1, wherein the substrate is electrically conductive and solderable.

14. The apparatus of claim 1, wherein the apparatus includes materials for a release layer to be deposited onto the work piece.

15. The apparatus of claim 1, wherein the apparatus includes materials for one or more barrier layers to protect the electrochemical device.

16. The apparatus of claim 1, wherein the apparatus is configured such that the materials for a thin film battery device is arranged with adjacent anode and cathode layers thus eliminating redundant current collector layers.

17. The apparatus of claim 1, further comprising a computer device configured to direct the deposition process of a thin film battery device to have multiple stacks of thin film layers, wherein an overlying area is smaller than the underlying area to expose a region for electrical connection.

18. The apparatus of claim 1, wherein the work piece further comprises a reel-to-reel substrate cassette, the reel-to-reel substrate cassette being configured to mobilize the substrate material over the drum during the deposition of the plurality of layers, and plurality of vacuum deposition devices being provided in an in-line formation.

19. The apparatus of claim 1, wherein the work piece is in a fixed location and the plurality of vacuum deposition devices are movable and are brought into alignment with the work piece.

20. The apparatus of claim 19, wherein the plurality of vacuum deposition devices are fixed and the work piece is movable and is brought into alignment with the plurality of vacuum deposition devices.

* * * * *